United States Patent
Kojima et al.

(10) Patent No.: US 7,632,343 B2
(45) Date of Patent: Dec. 15, 2009

(54) ELECTROLESS PALLADIUM PLATING SOLUTION

(75) Inventors: Kazuhiro Kojima, Saitama (JP); Hideto Watanabe, Saitama (JP)

(73) Assignee: Kojima Chemicals Co., Ltd., Sayama-shi (JP)

( * ) Notice: Subject to any disclaimer, the term of this patent is extended or adjusted under 35 U.S.C. 154(b) by 0 days.

(21) Appl. No.: 12/186,136

(22) Filed: Aug. 5, 2008

(65) Prior Publication Data

US 2009/0044720 A1  Feb. 19, 2009

(30) Foreign Application Priority Data

Aug. 15, 2007 (JP) ............................. 2007-211855

(51) Int. Cl.
*C23C 18/44* (2006.01)
(52) U.S. Cl. ..................................... 106/1.24; 106/1.28
(58) Field of Classification Search ................ 106/1.24, 106/1.28
See application file for complete search history.

(56) References Cited

U.S. PATENT DOCUMENTS 3,418,143 A * 12/1968 Sergienko .................. 106/1.28
4,424,241 A * 1/1984 Abys ........................ 106/1.24
4,804,410 A * 2/1989 Haga et al. ................. 106/1.28
5,292,361 A * 3/1994 Otsuka et al. .............. 106/1.28
5,882,736 A * 3/1999 Stein et al. ................. 106/1.24
6,379,524 B1 * 4/2002 Lee et al. .................... 205/255

FOREIGN PATENT DOCUMENTS

| JP | 46-26764 | 8/1971 |
| JP | 62-124280 | 6/1987 |
| JP | 7-62549 | 3/1995 |
| JP | 2918339 | 4/1999 |

* cited by examiner

*Primary Examiner*—Helene Klemanski
(74) *Attorney, Agent, or Firm*—Venable LLP; Michael A. Sartori; Zayd Alathari

(57) ABSTRACT

An electroless palladium plating solution is capable of forming a pure palladium plating film directly on an electroless nickel plating film without (pre)treatment such as substituted palladium plating treatment or the like, which pure palladium plating film has good adhesion and small variations in plating film thickness. An electroless palladium plating solution includes: a first complexing agent, a second complexing agent, phosphoric acid or a phosphate, sulfuric acid or a sulfate, and formic acid or a formate: the first complexing agent being an organopalladium complex having ethylenediamine as a ligand: the second complexing agent being a chelating agent having a carboxyl group or a salt thereof and/or a water-soluble aliphatic organic acid or a salt thereof.

3 Claims, No Drawings

ELECTROLESS PALLADIUM PLATING SOLUTION

TECHNICAL FIELD

The present invention relates to an electroless palladium plating solution. More particularly, it relates to an electroless palladium plating solution capable of directly forming a pure palladium plating film having good adhesion on an electroless nickel plating film formed on a circuit, an electrode or the like of an electronic part having a micro-wiring without affecting the electroless nickel plating film as an underlying film. Further, it relates to an electroless palladium plating solution capable of exhibiting excellent selective deposition properties, and capable of forming a pure palladium plating film having small variations in plating film thickness and further having excellent barrier effect against thermal diffusion of nickel particularly after heat treatment and having good soldering properties and further having good wire bonding properties because of uniformity and denseness of (palladium) crystals.

BACKGROUND ART

Heretofore, as surface treatment for electronic parts which are required to have high reliability, gold film plating has played a center role. However, gold is a material having scarcity value, and accordingly, every time its price sharply rises in succession in market quotations, technical development of alternative metals has attracted attention. Since palladium is inexpensive as compared with gold (bullion) and its metallic density is about 60% of that of gold, palladium has been in the spotlight as an alternative metal for reducing a film thickness of a gold plating film.

However, in highly reliable electronic parts in which not only inexpensiveness but also miniaturization of wiring have been accelerated in recent years, stability and selective deposition properties and reliability of a palladium plating film characteristics have been required.

As an electroless palladium plating solution used for industrial applications, there has heretofore been known, for example, an electroless palladium plating solution comprising a water-soluble palladium salt, ethylenedianimetetraacetic acid, ethylenediamine, and sodium hypophosphite, as described in Patent Document 1.

There has also been known an electroless palladium plating solution containing, as essential components, a palladium compound, at least one member selected from the group consisting of ammonia and an amine compound, an organic compound having divalent sulfur, and at least one member selected from the group consisting of a hypophosphorous acid compound and a boron hydride compound (see, for example, Patent Document 2). From these electroless palladium plating solutions, a palladium-phosphorous alloy plating film is obtained.

In Patent Document 3, there is disclosed, for example, a chemical bath preparation which comprises a palladium salt such as palladium chloride, palladium sulfate, palladium nitrate, palladium acetate or the like, a complexing agent containing one or more nitrogen atoms, and a formic acid or a derivative thereof, and which has a pH value of 4 or higher, and in which no formaldehyde for depositing a palladium layer on a metal surface is present.

Patent Document 4 discloses an electroless palladium plating solution comprising (a) 0.0001-0.5 mol/l of a palladium compound, (b) 0.0005-8 mol/l of at least one member selected from the group consisting of ammonia and amine compounds, and (c) 0.005-5 mol/l of at least one member selected from the group consisting of an aliphatic monocarboxylic acid, an aliphatic dicarboxylic acid, an aliphatic polycarboxylic acid, and water-soluble salts thereof.

The above-mentioned electroless palladium plating solution in Patent Document 1 has not only a drawback of poor storage stability but also a drawback that it is degraded in a short time in an industrial mass production line and thus has a short duration of life as a plating solution. Further, any of plating films obtained from the plating solution are crack-prone and poor in wire-bonding properties and soldering properties, and accordingly, has a difficulty in application to electronic parts.

Moreover, the electroless palladium plating solution disclosed in Patent Document 2 has a drawback that since phosphorus and/or boron derived from the hypophosphorous acid compound and/or the boron compound as a reductive component is contained in a plating film, properties of the palladium plating film markedly change between before and after heat test.

The chemical bath preparation disclosed in Patent Document 3 has not only a drawback of poor storage stability but also a drawback that it is degraded in a short time in an industrial mass production line and thus has a short duration of life as a plating solution.

On the other hand, the palladium plating solution according to Patent Document 4 is a plating solution unsuitable for a highly reliable electronic part having a micro-wiring because anomalous deposition or deposition on other portions than a circuit or electrodes is likely to be caused in such a electronic part due to markedly high deposition rate of palladium in a mass production line. Further, there are technical problems that film thickness control is difficult because palladium plating rate changes with time as the plating solution is continuously used, and that the plating solution has a short duration of life.

Patent Document 1: Japanese Examined Patent Publication No. Sho 46 (1971)-26764

Patent Document 2: Japanese Unexamined Patent Publication No. Sho 62 (1987)-124280

Patent Document 3: Japanese Patent Publication No. 2918339

Patent Document 4: Japanese Unexamined Patent Publication No. Hei 7 (1995)-62549

DISCLOSURE OF INVENTION

Problems to be Solved by the Invention

The present invention enables formation of a pure palladium plating film having good adhesion directly on an electroless nickel plating film without affecting the electroless nickel plating film as an underlying film. The present invention provides an electroless palladium plating solution which has excellent bath stability, a long duration of bath life and a stable deposition rate and is excellent in selective deposition properties, and which is capable of obtaining a pure palladium plating film having small variations in film thickness.

Further, the present invention provides such an electroless palladium plating solution that the deposited film obtained therefrom has high crystal density and is excellent in film properties such as soldering properties, wire bonding properties and the like.

Means to Solve the Problems

The present inventors have completed the following invention in order to solve the above-described problems.

In other words, the present invention relates to (1) an electroless palladium plating solution comprising:

a first complexing agent, a second complexing agent, phosphoric acid or a phosphate, sulfuric acid or a sulfate, and formic acid or a formate;

the first complexing agent being an organopalladium complex having ethylenediamine as a ligand and selected from the group consisting of dichlorodiethylenediamine palladium, dinitritediethylenediamine palladium and diacetatediethylenediamine palladium; the second complexing agent being a chelating agent having carboxyl groups or a salt thereof and/or a water-soluble aliphatic organic acid or a salt thereof, the chelating agent having carboxyl groups or a salt thereof being ethylenediaminetetraacetic acid or a sodium salt, a potassium salt or an ammonium salt thereof, the water-soluble aliphatic organic acid or a salt thereof being at least one member selected from the group consisting of citric acid, diammonium citrate, sodium citrate, potassium citrate, malic acid, ammonium malate, sodium malate, potassium malate, maleic acid, and oxalic acid; and (2) the electroless palladium plating solution according to the item (1), which is capable of forming a palladium film having good adhesion directly on an electroless nickel plating film formed on a circuit or electrodes on an electronic part having a micro-wiring without pretreatment for inducing deposition of the palladium plating film on the electroless nickel plating film.

Effect of the Invention

An electroless palladium plating solution is provided which is capable of forming a pure palladium plating film having good adhesion directly on an electroless nickel plating film without pre-treatment such as substituted palladium plating treatment or the like, and which has excellent bath stability and a long duration of bath life and high and stable deposition rate and excellent selective deposition properties, and which is capable of obtaining a pure palladium plating film having small variations in plating film thickness. The deposited film obtained therefrom has uniformity and denseness of crystals and preferable film properties such as soldering properties, wire-bonding properties and the like.

BEST MODE FOR CARRYING OUT THE INVENTION

In the following, best mode for carrying out the present invention and Comparative Example will be described.

The electroless palladium plating solution of the present invention comprises, as an essential component, an organopalladium complex having ethylenediamine as a ligand (first complexing agent).

As the above-mentioned organopalladium complex (first complexing agent), dichlorodiethylenediamine palladium, dinitritediethylenediamine palladium, dinitrodiethylenediamine palladium and diacetatediethylenediamine palladium may be mentioned. Particularly preferred organopalladium complex (first complexing agent) is dichrolodiethylenediamine palladium.

As an inorganic palladium salt used in synthesis of the organopalladium complex having ethylenediamine as a ligand (first complexing agent), one having monovalent anions bonded with palladium is particularly preferred.

In other words, palladium (di)chloride, palladium nitrate, palladium nitrite, palladium acetate and the like are particularly preferred.

In the present, invention, it is important to preliminarily synthesize the above-mentioned organopalladium complex. If ethylenediamine as a ligand and an inorganic, palladium salt are separately incorporated at the time of plating bath preparation, i.e., initial make-up of plating bath, it is difficult to form stable organopalladium complex.

Accordingly, it is important in the present invention that ethylenediamine as a ligand (first complexing agent) and the inorganic palladium salt are preliminarily reacted in a molar ratio of 2:1 (in terms of ethylenediamine: palladium) to synthesize the organopalladium complex.

Since the synthesis of the complex involves high temperature exothermic reaction, temperature control is required during the synthetic reaction. The temperature is controlled to be within a range of 45 to 55° C. If the temperature is lower than 45° C., since the complex forming reaction between palladium and ethymenediamine does not advance well, stable organopalladium complex cannot be obtained. On the other hand, if the temperature is higher than 55° C., since bonding ratio (molar ratio) between palladium and ethylenediamine is changed, stable organopalladium complex cannot be obtained. It is important that the temperature is surely controlled to form stable organopalladium complex. If the organopalladium complex is unstable, a problem is caused in plating bath stability.

The organopalladium complex having ethylenediamine as a ligand (first complexing agent) which is incorporated in the electroless palladium plating solution of the present invention preferably has a concentration within a range of 0.0001 to 0.5 mol/l in terms of palladium. If the concentration is lower than 0.0001 mol/l, a deposition rate of a plating film is undesirably low. On the other hand, if the concentration is higher than 0.5 mol/l, further increase in the deposition rate is not realized. This is not practically advantageous.

The electroless palladium plating solution comprises, as an essential component, a chelating agent having a carboxyl group or groups or a salt thereof and/or a water-soluble aliphatic organic acid or a salt thereof (second complexing agent).

The above-mentioned second complexing agent preferably has two or more carboxyl groups in its molecule and may contain a nitrogen atom or no nitrogen atom in its molecule. It has been confirmed that the second complexing agent is concerned with the reaction system where palladium is deposited from the organopalladium complex by reductive reaction by means of a reducing agent to greatly influence crystallinity, deposition rate, selective deposition properties, and variations in film thickness during the deposition of palladium.

As the second complexing agent of the present invention, there may be mentioned, for example, ethylenediaminetetraacetic acid, disodium ethylenediaminetetraacetate, dipotassium ethylenediaminetetraacetate, diammonium ethylenediaminetetraacetate, citric acid, diammonium citrate, sodium citrate, potassium citrate, malic acid, ammonium malate, sodium malate, potassium malate, maleic acid, and oxalic acid.

The second complexing agent incorporated in the electroless palladium plating solution of the present invention preferably has a concentration within a range of 0.001 to 0.1 mol/l. If the concentration is lower than 0.001 mol/l, effect of the second complexing agent is not sufficiently exhibited. On the other hand, if the concentration is higher than 0.1 mol/l, variations in plating film thickness are undesirably large.

The electroless palladium plating solution of the present invention comprises, as an essential component, phosphoric acid or a phosphate. As phosphoric acid or the phosphate, there may be mentioned, for example, phosphoric acid, sodium phosphate, potassium phosphate, disodium hydrogenphosphate, sodium dihydrogenphosphate, dipotassium hydrogenphosphate, potassium dihydrogenphosphate, ammonium phosphate, diammonium hydrogenphosphate, and ammonium dihydrogenphosphate.

Further, the electroless palladium plating solution of the present invention comprises sulfuric acid or a sulfate as an essential component.

As sulfuric acid or the sulfate, for example, sulfuric acid, sodium sulfate, potassium sulfate, and ammonium sulfate may be mentioned.

The above-mentioned phosphor or the phosphate and sulfuric acid or the sulfate have buffering functions in the plating solution and thus exhibit effects of stabilizing pH of the plating solution in a range of 4.5 to 7.0. Since the pH influences the deposition rate of palladium, it is preferred to control the pH within a range of 5.5 to 6.5.

Each of phosphoric acid or the phosphate and sulfuric acid or the sulfate which is incorporated in the electroless palladium plating solution of the present invention preferably has a concentration in a range of 0.005 to 10 mol/l. If the concentration is lower than 0.005 mol/l, buffering effect cannot be obtained. On the other hand, if the concentration is higher than 10 mol/l, the component is likely to remain as a residue on a plating film. This is undesirable.

Further, the electroless palladium plating solution comprises, as an essential component, formic acid or a formate. Formic acid or the formate exhibits an effect as a reducing agent.

There is no particular restriction as to a cation of the above-mentioned formate, and thus the formate may contain any of sodium ion, ammonium ion and potassium ion.

Formic acid or the formate incorporated in the electroless palladium plating solution of the present invention has a concentration of 0.005 to 0.3 mol/l, preferably 0.01 to 0.3 mol/l. If the concentration is lower than 0.005 mol/l, a plating film is sufficiently formed. This is practically undesirable.

In the present invention, the plating solution has a pH of 3 to 10, and in particular, it is preferred that the pH be 4.5 to 7.0. If the pH is too low, stability of the plating bath is poor. If the pH is too high, the plating film is crack-prone. These are undesirable.

The plating solution of the present invention enables plating at a temperature in a range as wide as 20 to 90° C., and in particular, enables a preferable plating film which is smooth and lustrous to be obtained when the plating solution has a temperature of 40 to 80° C. A higher temperature of the solution tends to result in a higher deposition rate of the plating film. Accordingly, desired deposition rate is realized by appropriately setting the temperature within the above-mentioned range. Further, in the plating solution of the present invention, since the deposition rate of the plating film depends on a concentration of palladium as well as the temperature of the plating solution, the deposition rate of the plating film can also be controlled by appropriately setting the palladium concentration. Accordingly, a thickness of the plating film can be controlled with ease.

To form a plating film by means of the plating solution of the present invention, a substrate having catalytic activity on the reductive deposition of the palladium film is immersed in the plating solution having a temperature within the above-mentioned range.

A circuit or an electrode of an electronic part with a micro-wiring is made of a copper foil. In general, an electroless nickel plating film (nickel-phosphorus film) is formed on such a circuit or an electrode. When palladium plating was applied onto the electroless nickel plating film using the electroless palladium plating solution of the present invention, a uniform pure palladium film could be formed on the electrode in a micro-pattern of 20 μm L/S.

In the following, the present invention will be described further in detail with reference to Examples. It should be noted, however, that the present invention is by no means restricted to the following Examples, and that changes and modifications may be made so long as these do not depart from the scope of the invention.

EXAMPLES

| Composition of Electroless Palladium Plating Solution (1) | |
| --- | --- |
| dichlorodiethylenediamine palladium | 0.02 mol/l |
| disodium ethylenediaminetetraacetate | 0.02 mol/l |
| sodium sulfate | 0.05 mol/l |
| phosphoric acid | 0.05 mol/l |
| sodium formate | 0.1 mol/l |
| Composition of Electroless Palladium Plating Solution (2) | |
| dichlorodiethylenediamine palladium | 0.02 mol/l |
| citric acid | 0.05 mol/l |
| malic acid | 0.05 mol/l |
| disodium hydrogenphosphate | 0.05 mol/l |
| sulfuric acid | 0.05 mol/l |
| ammonium formate | 0.1 mol/l |
| Composition of Electroless Palladium Plating Solution (3) | |
| dichlorodiethylenediamine palladium | 0.02 mol/l |
| citric acid | 0.05 mol/l |
| tripotassium citrate | 0.05 mol/l |
| dipotassium hydrogenphosphate | 0.05 mol/l |
| sulfuric acid | 0.05 mol/l |
| potassium formate | 0.1 mol/l |
| Composition of Electroless Palladium Plating Solution (4) | |
| dinitritediethylenediamine palladium | 0.02 mol/l |
| maleic acid | 0.05 mol/l |
| oxalic acid | 0.05 mol/l |
| sodium formate | 0.1 mol/l |
| Composition of Electroless Palladium Plating Solution (5) | |
| diacetatediethylenediamine palladium | 0.02 mol/l |
| disodium ethylenediaminetetraacetate | 0.02 mol/l |
| citric acid | 0.05 mol/l |
| sodium sulfate | 0.05 mol/l |
| phosphoric acid | 0.05 mol/l |
| sodium formate | 0.1 mol/l |

Comparative Example

| Composition of Electroless Palladium Plating Solution (6) | |
| --- | --- |
| palladium sulfate | 0.01 mol/l |
| ethylenediamine | 0.2 mol/l |
| sodium formate | 0.3 mol/l |
| potassium dihydrogen phosphate | 0.2 mol/l |

In Comparative Example, pH of the plating solution was adjusted to 5.8 with formic acid.

Evaluation Method

Evaluations were carried out by performing electron-microscopic observation of a (cross-)section of a palladium film and solder spreading test, and measuring bonding strengths of wire-bondings, deposition rates, variations in film thickness, and bath stabilities (deposition rates and variations in film thickness at every MTO (metal turnover)).

Observation of Surface and (Cross-)Section of Palladium Film with Electron Microscope Each of glass-epoxy printed wiring boards was subjected to customary pre-treatment for electroless plating and electrolessly nickel-plated to form an electroless nickel plating film thereon. Then, a palladium plating film of 0.3 µm in thickness was formed further thereon by means of each electroless palladium plating solution of the present invention, and the resultant was (cross-)sectioned by a chemical polishing method. The surface and the (cross-)section of the electroless palladium plating film were observed with a scanning electron microscope.

Solder Spreading Test

Each of glass-epoxy copper-clad laminates of 30×30 mm in size as a test piece was subjected to customary pre-treatment for electroless plating and electrolessly nickel-plated to form an electroless nickel plating film thereon. Then, plating films of 0.1 µm, 0.3 µm, 0.5 µm in thickness were formed on the respective resultants by means of each electroless palladium plating solution of the present invention. Heat-treatment was performed at 180° C. for 120 minutes. As a comparative plating solution, an electrolytic pure palladium plating solution (trade name: K-pure palladium, a product of Kojima Chemicals Co., Ltd.) was used. Evaluation was made in accordance with ASTM-B-545. Conditions for soldering was such that temperature was 225° C. and heating time was 30 seconds.

Bonding Strength of Wire-Bonding

Each of glass-epoxy printed wiring boards was subjected to customary pretreatment for electroless plating and electrolessly nickel-plated to form an electroless nickel plating film thereon. Then, a palladium plating film was formed further thereon in a thickness of 0.15 µm by means of each electroless palladium plating solution of the present invention to obtain a test piece. As a comparative plating solution, an electrolytic pure palladium plating solution (trade name: K-pure palladium, a product of Kojima Chemicals Co., Ltd.) was used. The plated test piece was subjected to heat test at 180° C. for 60 minutes. Wire bonding was performed before and after the heat test. In the wire bonding, all wires have a diameter of 25 µm, and a ball bonding apparatus (UBB-5-1 Model) was used. Using a pull tester (UJ-2-46-1C Model), pull strengths were measured.

The electrolytic pure palladium plating solution (trade name: K-pure palladium, a product of Kojima Chemicals Co., Ltd.) used as the comparative plating solution is a plating preparation that has been actually used and showed good results in semiconductor parts which require wire bonding or soldering.

Deposition Rate, Variations in Plating Film Thickness, and Bath Stability 0 to 3 MTO (metal turnover) load test was conducted, and deposition rates and variations in plating film thickness at the times of 0, 1, 2 and 3 MTO were measured by a fluorescence X-ray (thin) film thickness meter of SFT 300 model. The plating operation was performed under such conditions that bath temperature was 70° C. and plating time was 5 minutes.

Results of Observation of Crystallinity of Film Surface and Cross-Section of Electroless Palladium Plating Film by means of Electron Microscope Each of the electroless palladium plating films derived from the electroless palladium plating solutions (1) to (3) had a high crystal density. In the cross-section observation, each of the electroless nickel plating film and the electroless palladium plating film was found to form a clear film layer, and no spots in which the electroless nickel plating film was affected were observed.

Results of Evaluation Based on Solder Spreading Test

Each of test pieces was subjected to pretreatment for electroless plating and to electroless nickel plating. Then, using each of the electroless palladium plating solutions (1) to (3), an electroless palladium plating film was formed thereon in a thickness of 0.1 µm, 0.3 µm or 0.5 µm. As a comparative test piece, using an electrolytic pure palladium plating solution, a plating film was formed on the nickel-plated test piece in a thickness of 0.1 µm, 0.3 µm or 0.5 µm. The electroless nickel plating film as an underlying film was formed in a thickness of 5 µm using a commercially available plating bath. With respect to each of the test pieces, heat test was carried out at 180° C. for 120 minutes.

Soldering temperature was 225° C. and soldering time was 30 seconds. The results are shown in Table 1.

TABLE 1

| plating film thickness (µm) | 0.1 | 0.3 | 0.5 |
|---|---|---|---|
| e-less Pd plating soln. comp. (1) | 84.1% | 83.0% | 81.1% |
| e-less Pd plating soln. comp. (2) | 82.0% | 81.0% | 80.2% |
| e-less Pd plating soln. comp. (3) | 83.4% | 80.5% | 82.1% |
| electrolytic Pd plating soln. | 84.5% | 81.0% | 82.4% |

Results of Evaluation of Wire Bonding Strength

Using a lead frame for 1C, each of test pieces for evaluation of bonding strength of wire bonding was prepared. Each of the copper lead frames was subjected to pre-treatment for electroless plating and electrolessly nickel-plated and then electrolessly palladium-plated to form an electroless palladium film in a thickness of 0.15 µm. As a comparative test piece, a test piece was used which had been subjected to electrolytic pure palladium plating to form a pure palladium film in a thickness of 0.15 µm instead of the electroless palladium plating. With respect to each of the test pieces, heat test was carried out at 180° C. for 60 minutes. Each of the test pieces was subjected to wire bonding, and then wire pull strength was evaluated. The results are shown in Table 2. Average values in the tests repeated 100 times are shown. A bonding device of UBB-5-1 model and a pull tester of UJ-246-1C model were used.

TABLE 2

| heat test | e-less Pd plating soln. | | | | | | e-lytic Pd | |
|---|---|---|---|---|---|---|---|---|
| 180° C., | comp.(1) | | comp.(2) | | comp.(3) | | plating soln. | |
| 60 min | bef. | aft. | bef. | aft. | bef. | aft. | bef. | aft. |
| bonding str. (g) | 6.3 | 6.5 | 6.2 | 6.4 | 6.3 | 6.2 | 6.5 | 6.5 |
| breakage spot | 100% | 100% | 100% | 100% | 100% | 100% | 100% | 100% |
| evaluation | good | good | good | good | good | good | good | good |

Results of Evaluation of Deposition Rate, Variations in Plating Film Thickness, and Bath Stability Deposition rates and variations in plating film thickness were measured at every metal turnover. The results are shown in Table 3 (unit: µm).

A fluorescence X-ray (thin) film thickness meter of SFT-3300 model produced by Seiko Instruments Inc. was used.

TABLE 3

| plating soln. | 0 MTO | 1.0 MTO | 2.0 MTO | 3.0 MTO |
|---|---|---|---|---|
| comp.(1) | 0.55(±0.10) | 0.54(±0.14) | 0.53(±0.09) | 0.51(±0.09) |
| comp.(2) | 0.53(±0.11) | 0.52(±0.12) | 0.53(±0.09) | 0.51(±0.09) |
| comp.(3) | 0.53(±0.10) | 0.52(±0.11) | 0.50(±0.10) | 0.50(±0.11) |
| comp.(6) | 0.43(±0.23) | 0.40(±0.24) | bath decomp. | bath decomp. |

It is understood from Table 1 that (the plating films derived from) the electroless palladium plating solutions (1) to (3) of the present invention showed good solder spreading ratios before and after the heat tests, which were comparable to those of (the plating films derived from) the comparative electrolytic palladium plating solution. In other words, (the plating films derived from) the electroless palladium plating solutions (1) to (3) of the present invention were found to have excellent solderabilities.

It is understood from Table 2 that (the plating films derived from) the electroless palladium plating solutions (1) to (3) of the present invention showed good wire bonding properties before and after the heat tests, which were comparable to those of (the plating films derived from) the comparative electrolytic palladium plating solution. In other words, (the plating films derived from) the electroless palladium plating solutions (1) to (3) of the present invention were found to have excellent wire bonding properties.

It is understood from Table 3 that the electroless palladium plating solutions (1) to (3) provided plating films having small variations in plating film thickness and showed stable deposition rates even at 3 MTO, and that the electroless palladium plating solutions of the present invention were not decomposed even after 3 MTO although the plating solution (composition (6)) of Comparative Example 1 was decomposed after 1 MTO.

It is understood from the foregoing that the electroless palladium plating solution of the present invention is capable of providing plating films having extremely small variations in plating film thickness and is stable in deposition rate and excellent in bath stability.

The invention claimed is:

1. An electroless palladium plating solution comprising:
   a first complexing agent, a second complexing agent, phosphoric acid or a phosphate, sulfuric acid or a sulfate, and formic acid or a formate;
   said first complexing agent being an organopalladium complex having ethylenediamine as a ligand, wherein said first complexing agent is selected from the group consisting of dichlorodiethylenediamine palladium, dinitritediethylenediamine palladium and diacetatediethylenediamine palladium which are respectively synthesized by preliminary reacting ethylenediamine as a ligand with an inorganic palladium salt in a molar ratio of 2:1;
   said second complexing agent being a chelating agent having carboxyl groups or a salt thereof and/or a water-soluble aliphatic organic acid or a salt thereof, said chelating agent having carboxyl groups or a salt thereof being ethylenediaminetetraacetic acid or a sodium salt, a potassium salt or an ammonium salt thereof,
   said water-soluble aliphatic organic acid or a salt thereof being at least one member selected from the group consisting of citric acid, diammonium citrate, sodium citrate, potassium citrate, malic acid, ammonium malate, sodium malate, potassium malate, maleic acid, and oxalic acid.

2. The electroless palladium plating solution according to claim 1, which is capable of forming a palladium film having good adhesion directly on an electroless nickel plating film formed on a circuit or electrodes on an electronic part having a micro-wiring without pretreatment for inducing deposition of the palladium plating film on the electroless nickel plating film.

3. The electroless palladium plating solution according to claim 1, wherein the inorganic palladium salt is one or more selected from the group consisting of palladium dichloride, palladium nitrate, palladium nitrite, and palladium acetate.

* * * * *